(12) United States Patent
Maixner

(10) Patent No.: US 11,561,274 B1
(45) Date of Patent: Jan. 24, 2023

(54) MICROWAVE BRIDGE CIRCUIT FOR SEPARATING A TRANSMISSION SIGNAL FROM A RECEPTION SIGNAL

(71) Applicant: Bruker BioSpin GmbH

(72) Inventor: Michael Maixner, Bietigheim (DE)

( * ) Notice: Subject to any disclaimer, the term of this patent is extended or adjusted under 35 U.S.C. 154(b) by 0 days.

(21) Appl. No.: 17/929,488

(22) Filed: Sep. 2, 2022

(30) Foreign Application Priority Data

Sep. 2, 2021 (DE) ............... 10 2021 209 675.1

(51) Int. Cl.
*G01R 33/60* (2006.01)
(52) U.S. Cl.
CPC .................. *G01R 33/60* (2013.01)
(58) Field of Classification Search
CPC .................. G01R 33/345; G01R 33/60
See application file for complete search history.

(56) References Cited

U.S. PATENT DOCUMENTS

| | | | |
|---|---|---|---|
| 4,782,296 A | 11/1988 | Schmalbein et al. | |
| 5,678,548 A * | 10/1997 | Murugesan | G01R 33/60 |
| | | | 600/413 |
| 5,828,216 A * | 10/1998 | Tschudin | H03G 1/0088 |
| | | | 324/322 |
| 2008/0164874 A1 | 7/2008 | White et al. | |
| 2014/0091802 A1* | 4/2014 | Yang | G01R 33/60 |
| | | | 324/322 |

FOREIGN PATENT DOCUMENTS

DE    3933439 A1    10/1990

OTHER PUBLICATIONS

Aloisi et al., "A capacitive probe for Electron Spin Resonance detection", Journal of Magnetic Resonance, 263 (2016), 116-121.
Nakaoka, Ririko, et al., "Noise characteristics of a 750-MHz electronically turntable resonator for electron paramagnetic resonance spectroscopy". AIP Advances 9, 075312 (2019).

* cited by examiner

*Primary Examiner* — Steven L Yeninas
(74) *Attorney, Agent, or Firm* — Benoit & Côté Inc.

(57) ABSTRACT

A microwave bridge circuit routes a transmission signal from a transmitter to a resonator and forwards the reception signal generated in the resonator to a receiver. It includes two electrical lines connected in parallel at a first circuit point TX, where the transmission signal is divided. The first electrical line has an attenuator for attenuating a first transmission signal portion. The second electrical line carries a second transmission signal portion and connects to the resonator at a second circuit point R, which divides it between section L1, which runs from TX to R, and section L2, which runs from R to a third circuit point RX. The length of the sections L1 and L2 corresponds to an odd integer multiple of one quarter of the wavelength of the transmission signal, and the divided transmission signal portions are combined at RX, where the reception signal is forwarded to the receiver.

14 Claims, 5 Drawing Sheets

MICROWAVE BRIDGE CIRCUIT FOR SEPARATING A TRANSMISSION SIGNAL FROM A RECEPTION SIGNAL

BACKGROUND OF THE INVENTION

Field of the Invention

The invention relates to a microwave bridge circuit for separating a transmission signal from a reception signal, in particular for electron spin resonance (ESR) applications, and having an electrical circuit, which routes a transmission signal from a transmitter to a resonator connected to the circuit and forwards a reception signal generated in a resonator to a receiver. Such a microwave bridge circuit has been disclosed by Aloisi et al., "A capacitive probe for Electron Spin Resonance detection", Journal of Magnetic Resonance, 263 (2016), 116-121.

Description of the Related Art

The present invention relates in general to the field of electrical circuits for separating a transmission signal from a reception signal. Such electrical circuits are used for example in the field of electron spin resonance, for instance in ESR spectrometers.

Electron spin resonance is a method in instrumental analytics using which the chemical structure, the dynamics and the spatial distribution of paramagnetic centers of measurement samples having unpaired electrons are able to be determined. For this purpose, radiofrequency radiation (typically microwave-frequency radiation) is radiated into a measurement sample that has a permanent magnetic moment and that is located in a strong static magnetic field. The electromagnetic reaction of the sample is then measured.

Microwave bridges are often used in ESR spectrometers. These microwave bridges contain both the source of the microwave radiation and the detector. The source of the microwave radiation generates the microwave radiation, which is routed to the resonator of a sample to be measured in the form of a transmission signal. The microwave radiation is partially absorbed and reflected by the sample. Microwave radiation reflected from the resonator is routed to the detector in the form of a receiver signal. The microwave radiation traveling to the resonator and that coming from the resonator are separated from one another by a circulator, such that only the microwave radiation reflected in the resonator is routed to the detector, and the measurement is thus improved.

The circulator is thus used to separate the transmission signal from the reception signal. However, this component is not suitable for operation directly at the resonator on which the measurement is performed and the strong magnetic field prevailing there. In order to space the circulator from the strong magnetic field, use is made of waveguides of coaxial cables. However, these may have a spatial extent and entail losses in the transmission signal and reception signal. The ESR spectrometer accordingly becomes larger, and the ESR measurements become less accurate.

US 2008/0164874 A1 describes a miniaturized ESR spectrometer that makes do without a circulator in the sample head. The mini ESR spectrometer comprises a VCO (voltage-controlled oscillator), a power splitter, a mixer and a resonator. The power splitter has the function here of distributing the power generated in the VCO for transmission, on the one hand, and for the mixer, on the other hand, in order to downmix the received signal back to DC current at the mixer. According to US 2008/0164874 A1, the transmission signal and reception signal are separated in the resonator.

U.S. Pat. No. 4,782,296 A discloses an ESR spectrometer the resonator of which is loaded, via a microwave bridge, with microwave energy in the form of a continuous or intermittent signal. To achieve this, the microwave energy generated by a microwave source is routed via a first and/or second channel and accordingly converted there. The first and the second channel are then recombined and the signal is forwarded to the resonator via a circulator. According to reference U.S. Pat. No. 4,782,296 A, the transmission signal and reception signal are separated in the circulator upstream of the resonator.

The aforementioned article to Aloisi et al. discloses an option of constructing an ESR CW bridge that likewise does not require a circulator in order to separate the transmission signal and the reception signal. The ESR CW bridge comprises a generator, two splitters, a coupler, a resonator and a receiver with two mixers. A fixed fraction of the transmission power is coupled in via the coupler such that this portion of the power in theory flows completely in the direction of the resonator. Power reflected by the resonator is in theory routed almost completely to the receiver. The splitters are used to divide the microwave radiation from the generator or the reception signal from the resonator onto the two mixers of the receiver.

SUMMARY OF THE INVENTION

The present invention provides a microwave bridge circuit of the type described at the outset that makes do completely without a magnetic field-sensitive circulator, and is therefore able to be placed particularly close to the measurement resonator in the strong magnetic field prevailing there, but is still able to reliably separate a transmission signal from a reception signal. The electrical circuit comprises two parallel-connected electrical lines, having a first circuit point TX, at which the transmission signal is divided onto a first electrical line and onto a second electrical line, the first electrical line, which has an attenuator for attenuating a first divided transmission signal, the second electrical line, which is connected to the resonator at a second circuit point R via a branch line, wherein a second divided transmission signal is divided at the second circuit point R and wherein the second electrical line is divided into two sections L1 and L2, wherein the first section L1 runs from the first circuit point TX to the second circuit point R and the second section L2 runs from the second circuit point R to a third circuit point RX and forwards the transmission signal remaining at the second circuit point R, wherein the length of the sections L1 and L2 of the second electrical line in each case corresponds to an odd integer multiple of one quarter of the wavelength of the transmission signal, and wherein the divided transmission signals from the first electrical line and the second electrical line are combined at the third circuit point RX and the reception signal generated in the resonator is forwarded to the receiver.

In the microwave bridge circuit according to the invention, in order to separate the transmission signal and the reception signal, the circulator typically used in such devices is dispensed with completely, and instead an electrical circuit that is suitable for separating a transmission signal from a reception signal is established. This electrical circuit consists of an arrangement of electrical conductor tracks and an attenuator ("resistor").

This electrical circuit comprises an incoming electrical line that divides into two parallel-connected electrical lines at a circuit point TX. The transmission signal coming from the transmitter, typically microwave power, is able to be divided, at this circuit point TX, into two signals of equal size, onto a first electrical line and a second electrical line.

The first electrical line comprises an attenuator, as is typically installed in almost all known microwave bridges in terms of its function—but not in terms of its structure. Attenuators in RF technology normally have a structure such that the characteristic impedance at the input and output is for example 50 ohms, this not being the case in the arrangement according to the invention.

Attenuators in microwave bridge circuits are commonly tasked for example with making available a variable transmission power for a measurement. In the microwave bridge circuit according to the invention, the attenuator may be used to attenuate a first divided transmission signal. The second electrical line comprises a first section L1, a second circuit point R to which the resonator is connected via a branch line and a second section L2. A second divided transmission signal may be routed through the first section L1 and be divided, at the second circuit point R, into a second divided transmission signal that is routed to the resonator. A remaining transmission signal may then be routed to a circuit point RX via the section L2. In order for the first divided transmission signal on the first electrical line and the remaining transmission signal on the second electrical line to be able to cancel one another out at the circuit point RX, the voltage of both signals has to be the same and the phases of both signals have to be shifted by 180°.

The first divided transmission signal on the first electrical line will typically have a higher power than the remaining transmission signal on the second electrical line, since the remaining transmission signal on the second electrical line is a divided portion of the second divided transmission signal. Ideally, however, that is to say when the resonator is optimally tuned, the division of the transmission power at the point TX is 1:1.

In order for the power of both signals to be the same, the first divided transmission signal on the first electrical line may be attenuated by the attenuator to the extent that the power of the first divided transmission signal corresponds to the power of the remaining transmission signal.

A phase shift of 180° may easily be achieved by virtue of the length of the sections L1 and L2 of the second electrical line each corresponding to an odd integer multiple of one quarter of the wavelength of the transmission signal. The sections L1 and L2 may be of different lengths, wherein the length always corresponds to an odd integer multiple of one quarter of the wavelength of the transmission signal. This makes it possible to configure the structure of the second electrical line and the positioning of the circuit point R and the resonator in a particularly flexible manner.

If the first divided transmission signal, attenuated with the power of the remaining transmission signal, then collides with the divided transmission signal that has been phase-shifted by 180° at the circuit point RX, these two signals cancel one another out at the circuit point RX. A reception signal ("ESR signal") arising in the resonator is able to be routed, via the line point R and via the section L2, to the circuit point RX, and then routed from there to a receiver. Separation of transmission signal and reception signal is thereby able to be implemented easily.

The structure according to the invention of the electrical circuit thus does not require any circulator and makes it possible to easily separate the transmission signal from the reception signal. The time of flight differences between transmission signal and reception signal may thus be reduced to a minimum. This may have a positive effect on the behavior in relation to phase noise. The electrical circuit may furthermore be constructed in a highly compact and space-saving manner, thereby enabling use even at low temperatures.

In the case of a detuned resonator, changing the power of the first divided transmission signal by appropriately setting the attenuator and the phase shifter makes it possible to achieve a situation whereby the first divided transmission signal and the remaining transmission signal cancel one another out at the circuit point RX, and good measurement results are still able to be obtained.

Detuning of the resonator cannot be compensated for in the arrangements known from the prior art by adjusting an attenuator and a phase shifter.

In preferred variants, the microwave bridge circuit according to the invention may be equipped with an RF generator for generating the transmission signal, a splitter for dividing the transmission signal and a first amplifier for amplifying the transmission signal. The RF generator may generate a radiofrequency signal that is able to be routed to the electrical circuit and to the resonator as transmission signal. The transmission signal may be divided with the aid of the splitter and routed to a mixer and to the electrical circuit and to the resonator. The transmission signal may be amplified by the amplifier, thereby making it possible for example to improve the quality of ESR measurements.

In very particularly preferred embodiments of the microwave bridge circuit according to the invention, provision is made for the first electrical line to contain a phase shifter for shifting the phase of the first divided transmission signal.

Phase shifters are typically installed in almost all microwave bridges. Phase shifters in microwave bridge circuits are commonly tasked for example with rotating the phase of the measured signal so as to give maximum sensitivity. In the microwave bridge circuit according to the invention, the phase shifter may be used to shift the phase of the first divided transmission signal. If the phase of the remaining transmission signal from the second electrical line is not shifted exactly 180° with respect to the phase of the first divided transmission signal, then the phase of the first divided transmission signal may easily be adjusted so that the first divided transmission signal and the remaining transmission signal cancel one another out at the circuit point RX. In the case of a detuned resonator, changing the phase of the first divided transmission signal makes it possible to achieve a situation whereby the first divided transmission signal and the remaining transmission signal cancel one another out at the circuit point RX, and good measurement results are still able to be obtained.

One preferred class of embodiments of the microwave bridge circuit according to the invention is distinguished in that the electrical circuit is constructed from non-magnetic material.

This makes it possible to avoid interference in the homogeneous magnetic field during measurements at the resonator. The electrical circuit itself is also able to be designed to be smaller and more compact, which is advantageous for production, and in particular opens up new possibilities for ESR sensors.

In further preferred embodiments, the microwave bridge circuit according to the invention is designed to be able to be tuned via the phase shifter and the attenuator.

This makes it possible to dispense with an AFC (automatic frequency control) circuit for automatic frequency control purposes. In conventional microwave bridge circuits, the AFC circuit is tasked with setting the transmission frequency ("operating frequency") of a microwave oscillator such that it coincides with the resonant frequency of the resonator. For this purpose, information is obtained from the reception signals ("output signals") from the microwave bridge circuit, which information is suitable for initiating electronic or mechanical detuning of the microwave oscillator. By virtue of the bridge circuit according to the invention having a phase shifter and an attenuator, it is possible to establish a fixed-frequency bridge that makes do without expensive components that would normally be required for an AFC circuit. A fixed-frequency bridge additionally has the advantage that the generator for generating the microwave power is able to operate at a fixed frequency. Such an oscillator may be constructed with very little phase noise, which is a requirement for optimum measurement results in the case for example of CW microwave bridge circuits.

Further preference is given to embodiments of the microwave bridge circuit according to the invention that are distinguished in that the phase shifter, the attenuator and the first electrical line are designed such that the frequency of the RF generator remains uninfluenced by the operation of the phase shifter and the attenuator.

The receiver of the microwave bridge circuit may thereby be "given the impression" of an optimally tuned microwave bridge circuit. This is a requirement for good sensitivity of the microwave bridge circuit.

Preference is also given to variants of the microwave bridge circuit according to the invention that are distinguished in that the phase shifter, the attenuator and the first electrical line are designed such that the resonant frequency of the resonator remains uninfluenced by the operation of the phase shifter and the attenuator. This makes it possible to improve the quality of the measurement results.

Preference is likewise given to embodiments of the microwave bridge circuit according to the invention in which the amplitude and/or the phase of the first divided transmission signal are tuned via pin diodes and/or varactor diodes.

This is proven in practice. The power and the phase of the transmission signal may be adjusted by changing the quiescent current and the voltage. It is also possible to achieve fast tuning of the microwave bridge circuit according to the invention. Using the circuit according to the invention does admittedly generate losses that would not normally occur when using a circulator. To compensate for this, the transmission power may be doubled and the reception signal may be measured twice and accumulated. The quality of the measurements may thus be improved by increasing a transmitter output power on the transmission side. The sensitivity at the receiver may be increased by doubling the number of measurements on a reception side.

A further preferred class of embodiments of the microwave bridge circuit according to the invention is distinguished in that the resonator is matched such that the as yet undivided transmission signal is divided, to different proportions at the first circuit point TX, onto the first electrical line and the second electrical line.

As a result, the complete incoming transmission signal is not absorbed at the resonator, but rather a portion of the power of the transmission signal is reflected. A remaining transmission signal and the transmission signal reflected at the resonator thus arrive at the circuit point RX. The first divided transmission signal may be set by the attenuator and the phase shifter such that the first divided transmission signal and the transmission signals on the second electrical line cancel one another out. This structure makes it possible to perform high-quality measurements even when the resonator is not optimally matched. Fine-tuning of an iris and/or of the frequencies of the resonator and/or microwave source may be dispensed with.

In one alternative class of embodiments of the microwave bridge circuit according to the invention, the attenuator and the phase shifter are set such that the transmission signal from the first electrical line and the rest of the transmission signal from the second electrical line collide at the third circuit point RX with exactly equal proportions but with a 180 degree phase shift. The transmission signal from the first electrical line and the rest of the transmission signal from the second electrical line may thereby cancel one another out precisely at the third circuit point RX. The transmission signal may thereby be separated cleanly from the reception signal.

Preference is likewise given to embodiments of the microwave bridge circuit according to the invention in which the electrical circuit is operated at a frequency of around 10 GHz, and wherein the outer dimensions of the electrical circuit do not exceed 1 cm×3 cm×3 cm.

This frequency is a frequency commonly used in practice. The outer dimensions of the electrical circuit allow a particularly compact structure.

The scope of the present invention also encompasses an ESR spectrometer having a microwave bridge circuit for separating a transmission signal from a reception signal as described above, having an RF generator for generating the transmission signal, having a splitter for dividing the transmission signal onto at least one mixer and a first amplifier for amplifying the transmission signal and having an electrical circuit that routes a transmission signal from a transmitter to a resonator connected to the circuit and forwards a reception signal generated in the resonator by the substance to be analyzed to a receiver. The numerous advantages of the microwave bridge circuit according to the invention apply in practice particularly well in the case of a structure of this type of an ESR spectrometer.

One preferred class of embodiments of the ESR spectrometer according to the invention is distinguished in that the bridge circuit comprises a second amplifier for amplifying the reception signal. The quality of the reception signal and the quality of the measurements is thereby able to be improved even further.

Preference is likewise given to embodiments of the ESR spectrometer according to the invention in which the first amplifier for amplifying the as yet undivided transmission signal and the second amplifier for amplifying the reception signal are attached to the bridge circuit without any cables. This makes it possible to avoid losses on the most sensitive point of the ESR device, since no additional cables and plug connectors are attached. The space requirement of the ESR spectrometer may also be further reduced.

In further preferred embodiments of the ESR spectrometer according to the invention, the electrical circuit has a receiver input stage arranged directly on the resonator.

This particularly compact arrangement is particularly proven in practice and is not present in this form in ESR CW bridges known from the prior art.

Further preferred embodiments of the ESR spectrometer according to the invention are distinguished in that a fixed-frequency bridge is present in the electrical circuit.

The fixed-frequency bridge has the advantage that the generator for generating the microwave power is able to operate at a fixed frequency. Such a generator may be constructed with very little phase noise, which is a requirement for good measurement results in the case of CW microwave bridge circuits.

Further advantages of the invention will become apparent from the description and the drawings. The features mentioned above and those explained further below may likewise, according to the invention, each be used individually on their own or in multiple form in any desired combinations. The embodiments that are shown and described should not be understood to be a definitive list, but rather are of an exemplary nature for outlining the invention.

BRIEF DESCRIPTION OF THE DRAWINGS

The invention is illustrated in the drawing and is explained in more detail with reference to exemplary embodiments. In the figures.

DETAILED DESCRIPTION

Figure 1:
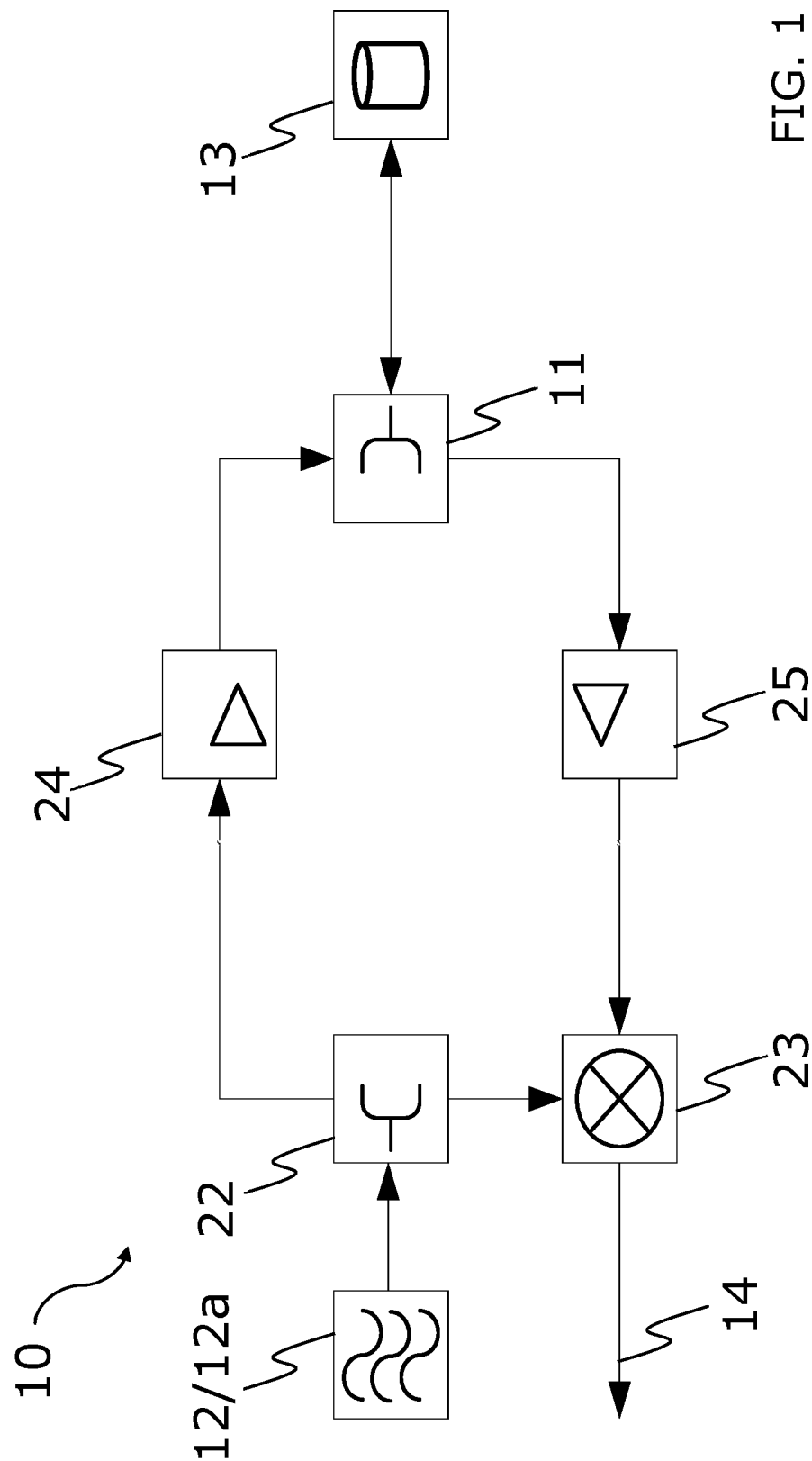
FIG. 1 shows a schematic block diagram of the microwave bridge circuit according to the invention.

FIG. 1 shows a schematic block diagram of a microwave bridge circuit 10 according to the invention, as may be used in an ESR spectrometer (not illustrated in more detail here).

In the embodiment shown here, the bridge circuit 10 comprises a microwave source 12, for example an RF generator 12a, a splitter 22, a mixer 23, a first amplifier 24, an electrical circuit 11, a resonator 13, a second amplifier 25 and a feed line 14 to a receiver.

The microwave source 12 generates microwave power that is routed on as transmission signal. This transmission signal is routed to the splitter 22. The transmission signal is divided at the splitter 22. One portion of the transmission signal is routed to the mixer 23, while the other portion of the transmission signal is routed to the first amplifier 24. In one embodiment, not shown here, the transmission signal may be divided onto multiple mixers 23 depending on the application.

The first amplifier 24 is attached without cables ("wirelessly") to the microwave bridge circuit 10 (not illustrated in more detail here). The wireless attachment of the amplifier 24 firstly reduces losses caused by additional cables and plug connectors. The general space requirement of the microwave bridge circuit 10 is also reduced, as a result of which the space requirement of the ESR spectrometer in which the microwave bridge circuit 10 is installed is also reduced. In one embodiment, not shown, the amplifier 24 may also be attached to the microwave bridge circuit 10 using cables.

The transmission signal is amplified at the first amplifier 24 and routed to the electrical circuit 11. The transmission signal is routed on from the electrical circuit 11 to the resonator 13. The resonator 13 contains a substance to be analyzed ("sample to be measured"). The microwave power of the transmission signal is partially absorbed and partially reflected by the sample to be measured. A signal arising in the resonator 13, which is intended for the receiver, is routed back to the electrical circuit 11 again as reception signal ("receiver signal").

Figure 3:
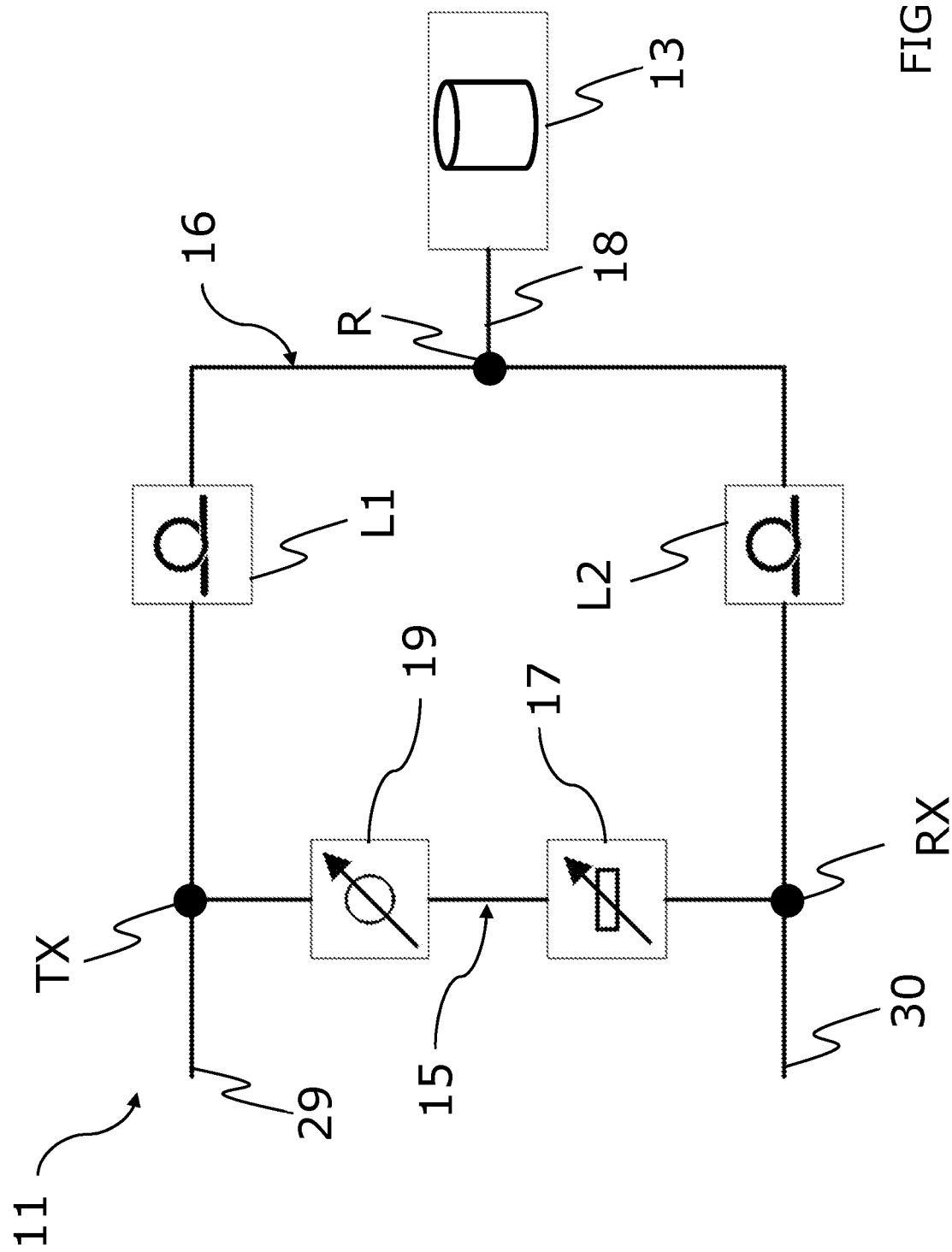
FIG. 3 shows a schematic block diagram of one embodiment of an electrical circuit, connected to a resonator, of the microwave bridge circuit according to the invention, by way of which a transmission signal is able to be separated from a reception signal.
Figure 4:
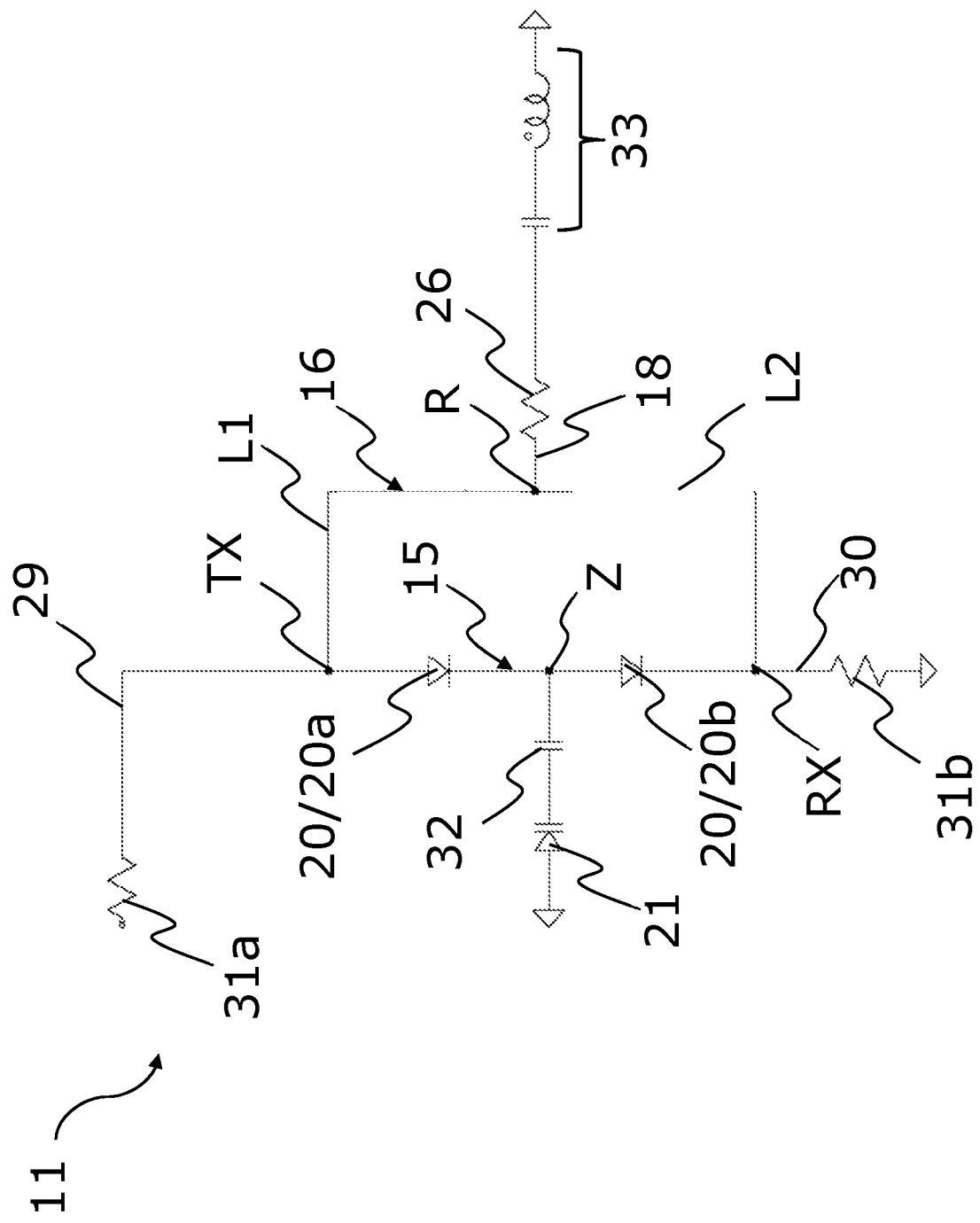
FIG. 4 shows a schematic circuit diagram of one embodiment of an electrical circuit of the microwave bridge circuit according to the invention.

The electrical circuit 11 in this case takes on the task of separating the transmission signals traveling to the resonator 13 and the reception signals coming from the resonator 13 from one another (a more detailed description in this regard is given in FIGS. 3 and 4). Only the transmission power, arising in the resonator 13, of the signal that arises is thus routed as reception signal to the receiver ("detector").

Figure 2:
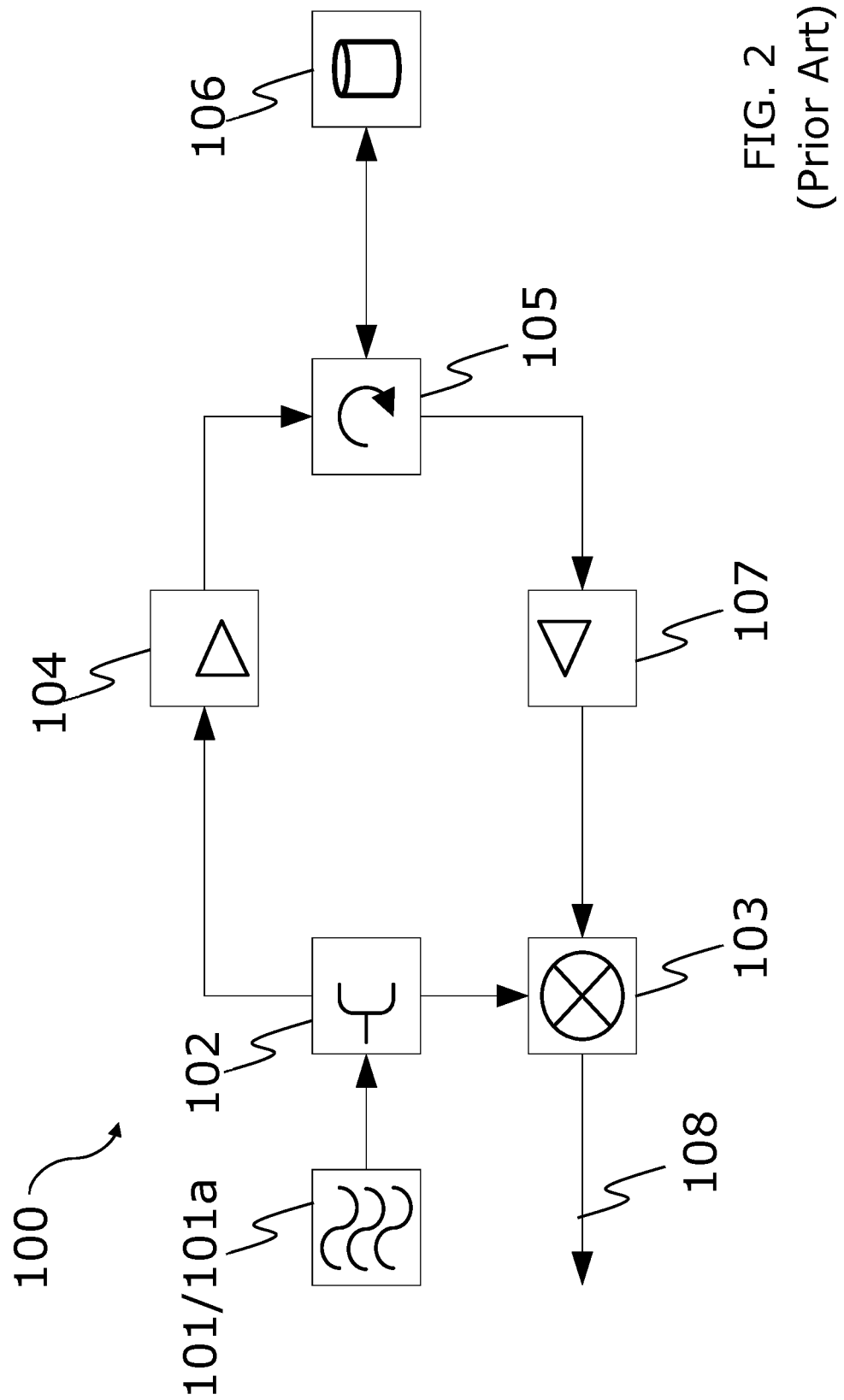
FIG. 2 shows a schematic block diagram of an exemplary microwave bridge circuit according to the prior art.

In microwave bridge circuits 10 according to the prior art, the task of the electrical circuit 11 is commonly taken on by a circulator (cf. FIG. 2 in this regard). The electrical circuit 11 is designed such that it takes up a space ("volume") of at most 1 cm×3 cm×3 cm. The dimensions mentioned here apply for an operating frequency of around 10 GHz. Although a circulator that is typically used has similar dimensions, the coaxial connectors and the cables with the minimum bending radii have to be factored into the space requirement, as a result of which the space requirement of a conventional circulator more than triples.

The electrical circuit may furthermore be produced from non-magnetic materials such as aluminum, copper, silver or gold. It is thereby possible to perform measurements at the resonator 13 in which the homogeneous magnetic field is not disrupted, or is disrupted only slightly, during measurements at the resonator 13. The electrical circuit 11 may furthermore move closer to the resonator 13.

The reception signal is routed to the second amplifier 25 in order to amplify the reception signal. The second amplifier 25 is also attached without cables ("wirelessly") to the microwave bridge circuit 10 (not illustrated in more detail here). The advantages resulting therefrom are in this case the same as the advantages that result for the first amplifier 24. The reception signal is routed from the amplifier 25 to the mixer 23. The reception signal upstream and downstream of the mixer 23 differs in terms of its frequency range. The frequency upstream of the mixer 23 is close to the transmission signal, for example 10 GHz, while the signal downstream of the mixer 23 is for example 0-1 MHz. The reception signal is then routed from there via the feed line 14 to the receiver.

FIG. 2, for comparison with FIG. 1, shows a schematic block diagram of an exemplary microwave bridge circuit 100 for an ESR spectrometer as has already been disclosed by the prior art.

The bridge circuit 100 comprises a microwave source 101, for example an RF generator 101a, a splitter 102, a mixer 103, a first amplifier 104, a circulator 105, a resonator 106, a second amplifier 107 and a feed line 108 to a receiver.

The microwave source 101 generates microwave power that is routed on as transmission signal. This transmission signal is routed to the splitter 102. The transmission signal is divided at the splitter 102. One portion of the transmission signal is routed to the mixer 103, while the other portion of the transmission signal is routed to the first amplifier 104. The transmission signal is amplified at the first amplifier 104 and routed to the circulator 105. The transmission signal is routed on from the circulator 105 to the resonator 106. The resonator 106 contains a sample to be measured.

The microwave power of the transmission signal is partially absorbed and partially reflected by the sample to be measured. A signal arising in the resonator 106, which is intended for the receiver, is routed back to the circulator 105 again as receiver signal. The circulator 105 in this case takes on the task of separating the transmission signals traveling to the resonator 106 and the reception signals coming from the resonator 106 from one another. Only the transmission power, arising in the resonator 106, of the signal that arises is thus routed as reception signal to the receiver.

The reception signal is routed to the second amplifier 107 in order to amplify the reception signal. The reception signal is routed from the amplifier 107 to the mixer 103. The reception signal upstream and downstream of the mixer 103 differs in terms of its frequency range. The frequency upstream of the mixer 103 is close to the transmission signal, for example 10 GHz, while the signal downstream of the mixer 103 is for example 0-1 MHz. The reception signal is then routed from there via the feed line 108 to the receiver.

FIG. 3 shows a schematic block diagram of one embodiment of an electrical circuit 11, connected to the resonator 13, of the microwave bridge circuit according to the invention, as may be used in an ESR spectrometer and by way of which a transmission signal is able to be separated from a reception signal. The electrical circuit 11 may for example be operated at a frequency of 10 GHz.

In the form shown here, the electrical circuit 11 comprises an input line 29 coming from a transmitter, an output line 30 leading to the receiver, a first circuit point TX, a second circuit point R, a third circuit point RX, a first electrical line 15, a second electrical line 16, which is divided into a first section L1 and into a second section L2, a branch line 18, the resonator 13, an attenuator 17 and a phase shifter 19.

The input line 29 is connected to the first circuit point TX. At the first circuit point TX, the input line divides into the first electrical line 15 and the second electrical line 16. The first electrical line 15 and the second electrical line 16 are connected in parallel.

The first electrical line 15 runs between the first circuit point TX and the third circuit point RX and comprises the phase shifter 19 and the attenuator 17. The phase shifter 19 and the attenuator 17 may for example be in the form of pin diodes and varactor diodes (see FIG. 4 in this regard). In a further embodiment, not shown, the first electrical line 15 comprises only an attenuator 17.

The second electrical line 16 is divided into the first section L1, which leads from the first circuit point TX to the second circuit point R, and the second section L2, which leads from the second circuit point R to the third circuit point RX, at which the first electrical line 15 and the second electrical line 16 meet up again. The first section L1 and the second section L2 each have a length of an odd integer multiple of one quarter of the wavelength of the transmission signal.

At an operating frequency of 10 GHz, this corresponds, in the shortest possible case, that is to say the case in which the length of the sections L1 and L2 each correspond to one quarter of the wavelength of the transmission signal, to roughly a length of 2 mm to 7.5 mm per section L1 and L2. This length is dependent on the dielectric that is used. By way of example, this length would be roughly 7.5 mm in the case of air as dielectric. However, configurations in the form of a line structure on a substrate may also preferably be used, wherein a line length of less than 2.5 mm, that is to say of for example 2 mm, may likewise be achieved. The resonator 13 is connected to the circuit point R, and thus to the second electrical line 16, via the branch line 18.

The bridge circuit according to the invention is able to be tuned via the phase shifter 19 and the attenuator 17. The two components make it possible to use a fixed-frequency oscillator for a microwave bridge. This establishes a fixed-frequency bridge, and an AFC circuit for automatic frequency control purposes, containing expensive components, is dispensed with.

The phase shifter 19 and the attenuator 17 are designed such that the phase shifter 19 and the attenuator 17 do not, or not significantly, influence the frequency of the RF generator during operation. The receiver of the microwave bridge circuit is thereby given the impression of an optimally tuned microwave bridge circuit.

A distinction may essentially be drawn between two cases for the operation of the microwave bridge circuit with the electrical circuit 11. In the first case, the resonator is optimally matched, that is to say the resonator has an optimum impedance. In the second case, the resonator is unmatched, this is to say the resonator has an impedance that differs from the optimally set case.

First Case (Optimally Matched Resonator)

The transmission signal transmitted by the transmitter is routed to the electrical circuit 11 via the input line 29. At the first circuit point TX, the transmission signal is divided equally onto the first electrical line 15 as a first divided transmission signal and divided onto the second electrical line 16 as a second divided transmission signal.

The second divided transmission signal, which has half the power of the transmission signal transmitted by the transmitter, is routed from the first circuit point TX to the second circuit point R via the first section L1 of the second electrical line 16. When passing through the first section L1, the phase of the second divided transmission signal is rotated by 90°. The second divided transmission signal is again divided equally at the second circuit point R.

A first portion of the second divided transmission signal, which has one quarter of the power of the transmission signal transmitted by the transmitter, is in this case routed, via the branch line 18, to the resonator 13, which contains the sample to be measured. The incoming signal is absorbed completely by the sample in the resonator 13.

A second portion of the second divided transmission signal, which has one quarter of the power of the transmission signal transmitted by the transmitter, is routed from the circuit point R to the third circuit point RX via the second section L2 of the second electrical line 16. When passing through the second section L2, the phase of the second portion of the second divided transmission signal is rotated by 90°.

The second portion of the second divided transmission signal thus arrives at the third circuit point RX with one quarter of the power of the transmission signal transmitted by the transmitter and a phase shift of 180°. In order that the second portion of the second divided transmission signal and the first divided transmission signal cancel one another out, such that no further transmission signal is forwarded to the receiver via the output line 30, the first divided transmission signal is adjusted such that it has an identical power and a phase shifted by 180° with respect to the second portion of the second divided transmission signal.

For this purpose, the first divided transmission signal, which has half the power of the transmission signal transmitted by the transmitter, is routed from the first circuit point TX to the third circuit point RX through the first electrical line 15. In the process, the first divided transmission signal passes through the phase shifter 19 and the attenuator 17. The phase shifter 19 is set such that it does not shift the phase (that is to say it is set here to 0°), since the transmission signals already collide with a phase shift of 180° at the circuit point RX. The attenuator 17 is set such that the power of the first divided transmission signal is reduced by 50%, so that the first divided transmission signal also has one quarter of the power of the transmission signal transmitted by the transmitter. The transmission signals then cancel one another out at the third circuit point RX.

A reception signal ("ESR signal") arising in the resonator 13 is routed from the resonator, via the branch line 18, to the second circuit point R, and routed from there, via the section L2 of the second electrical line 16, to the third circuit point RX. From there, the reception signal, separated from the transmission signal, may be routed on to the receiver via the output line 30.

Second Case (Unmatched Resonator)

The transmission signal transmitted by the transmitter is routed to the electrical circuit 11 via the input line 29. At the first circuit point TX, the transmission signal is divided unequally onto the first electrical line 15 as the first divided transmission signal and divided onto the second electrical line 16 as the second divided transmission signal.

The second divided transmission signal, which has a portion of the power of the transmission signal transmitted by the transmitter, is routed from the first circuit point TX to the second circuit point R via the first section L1 of the second electrical line 16. When passing through the first section L1, the phase of the second divided transmission signal is rotated by 90°. The second divided transmission signal is then divided unequally at the second circuit point R.

The first portion of the second divided transmission signal, which has a portion of the power of the second divided transmission signal, is in this case routed, via the branch line 18, to the resonator 13, which contains the sample to be measured. The incoming signal is absorbed only partially by the sample in the resonator 13. The unabsorbed portion of the signal arriving at the resonator 13 is reflected and routed to the second circuit point R via the branch line 18.

The second portion of the second divided transmission signal, which has a portion of the power of the second divided transmission signal, and the transmission signal reflected at the resonator 13 are routed together from the circuit point R to the third circuit point RX via the second section L2 of the second electrical line 16. When passing through the second section L2, the phase of the second portion of the second divided transmission signal and the transmission signal reflected at the resonator 13 is rotated by 90°.

The second portion of the second divided transmission signal, together with the transmission signal reflected at the resonator 13, thus arrives at the third circuit point RX with a fraction of the power of the transmission signal transmitted by the transmitter and with a phase shift. In order that the second portion of the second divided transmission signal, together with the transmission signal reflected at the resonator 13, and the first divided transmission signal cancel one another out, such that no further transmission signal is forwarded to the receiver via the output line 30, the first divided transmission signal is adjusted such that it has an identical power and a phase shifted by 180° with respect to the second portion of the second divided transmission signal together with the transmission signal reflected at the resonator 13.

For this purpose, the first divided transmission signal, which has a portion of the power of the transmission signal transmitted by the transmitter, is routed from the first circuit point TX to the third circuit point RX through the first electrical line 15. In the process, the first divided transmission signal passes through the phase shifter 19 and the attenuator 17. The phase shifter 19 is set such that the first divided transmission signal and the second portion of the second divided transmission signal, together with the transmission signal reflected at the resonator 13, collide with a phase shift of 180°. The attenuator 17 is set such that the power of the first divided transmission signal corresponds to the power of the second portion of the second divided transmission signal together with the transmission signal reflected at the resonator 13. The transmission signals then cancel one another out at the third circuit point RX.

A reception signal arising in the resonator 13 is routed from the resonator, via the branch line 18, to the second circuit point R, and from there, via the section L2 of the second electrical line 16, on to the third circuit point RX. From there, the reception signal, separated from the transmission signal, may be routed on to the receiver via the output line 30.

FIG. 4 shows a schematic circuit diagram of one embodiment of an electrical circuit 11, as was described in FIG. 3, of the microwave bridge circuit according to the invention.

In the form shown here, the electrical circuit comprises the input line 29 coming from the transmitter, the output line 30 leading to the receiver, a first resistor 31a, a second resistor 31b, the first circuit point TX, the second circuit point R, the third circuit point RX, an additional circuit point Z, the first electrical line 15, the second electrical line 16, which is divided into the first section L1 and into the second section L2, the branch line 18, a resonator assembly 33, having a loss resistance 26 as the sum of all power-absorbing portions of the resonator and of the sample substance, pin diodes 20, more precisely a first pin diode 20a and a second pin diode 20b, a varactor diode 21 and a capacitor 32.

In this embodiment, the resistors 31a and 31b are used to enable a current flow through the pin diodes 20. The capacitor 32 is used here to separate a DC voltage present at the circuit point Z from the varactor diode 21. The voltage at the varactor diode 21 is able to be controlled independently of the DC voltage at the point Z. Generally speaking, neither the capacitor 32 nor the resistors 31a and 31b are necessary for the radiofrequency function of the circuit according to the invention.

Since the circuit diagram from FIG. 4 essentially illustrates the structure from FIG. 3 again in more detail, only the features not described up until now are discussed further.

The first electrical line 15 comprises the pin diodes 20a and 20b and is connected to the varactor diode 21 via the additional circuit point Z. The first divided transmission signal, more precisely the power ("amplitude") and the phase of the first divided transmission signal, are adjusted, in the embodiment shown here, via the pin diodes 20a and 20b and via the varactor diode 21 and tuned such that the transmission signals cancel one another out at the third circuit point RX and only the transmission signal arising at the resonator assembly 33 is forwarded to the receiver via the line 30.

Figure 5:
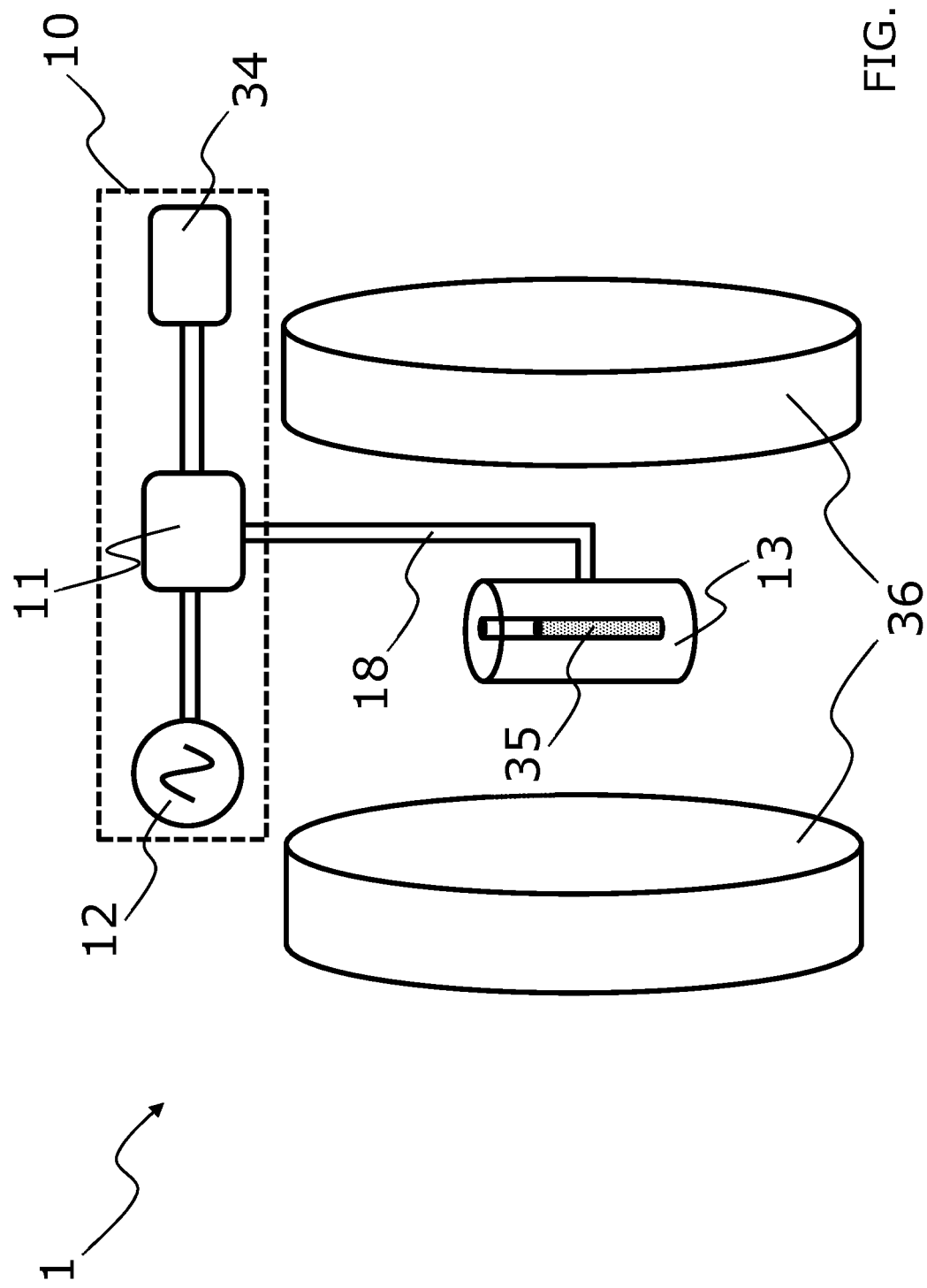
FIG. 5 shows a schematic measurement structure for performing an ESR measurement with an ESR spectrometer that contains the microwave bridge circuit according to the invention from FIG. 1.

FIG. 5 shows a schematic measurement structure for performing an ESR measurement with an ESR spectrometer 1 that contains the microwave bridge circuit 10 according to the invention from FIG. 1.

The microwave source 12, the electrical circuit 11 and the receiver 34 are shown here the microwave bridge circuit 10. The microwave source 12 is typically the RF generator 12a. The microwave bridge circuit 10 furthermore comprises the splitter, the mixer, the first amplifier and the second amplifier (not illustrated in more detail). As an alternative, a fixed-frequency bridge may also be integrated into the microwave bridge circuit 10. The first and the second amplifier may be attached to the bridge circuit 10 using cables or wirelessly.

The branch line 18 leads from the electrical circuit 11 to the resonator 13. A sample 35 to be measured is inserted into the resonator 13. The resonator 13 is furthermore surrounded by a magnet arrangement 36. In the example of FIG. 5, the electrical circuit 11 is positioned outside the magnet arrangement 36. It would also be possible to arrange the electrical circuit 11 between the magnetic poles directly at the measurement sample 35, since it is able to be produced without any magnetic components.

The invention claimed is:

1. A microwave bridge circuit that separates a transmission signal from a reception signal, routes the transmission signal from a transmitter to a resonator connected to the circuit, and forwards the reception signal generated in the resonator to a receiver, the circuit comprising:
   first and second electrical lines connected in parallel at a first circuit point TX, at which the transmission signal is divided between a first divided transmission signal on a first electrical line and a second divided transmission signal on a second electrical line,
   an attenuator on the first electrical line that attenuates the first divided transmission signal, and
   a second circuit point R that connects the second electrical line to the resonator via a branch line, the circuit point R dividing the second divided transmission signal between a first section L1 of the second electrical line that runs from the first circuit point TX to the second circuit point R and a second section L2 of the second electrical line that runs from the second circuit point R to a third circuit point RX,
   wherein the length of the sections L1 and L2 of the second electrical line each correspond to an odd integer multiple of one quarter of a wavelength of the transmission signal, and
   wherein the signals from the first electrical line and the second electrical line are combined at the third circuit point RX such that the reception signal generated in the resonator is forwarded to the receiver.

2. The bridge circuit as claimed in claim 1, wherein the circuit is constructed from non-magnetic material.

3. The bridge circuit as claimed in claim 1, wherein the first electrical line contains a phase shifter for shifting the phase of the first divided transmission signal.

4. The bridge circuit as claimed in claim 3, wherein the bridge circuit can be tuned via the phase shifter and the attenuator.

5. The bridge circuit as claimed in claim 3, wherein the phase shifter, the attenuator and the first electrical line are configured such that the frequency of an RF generator used to generate the transmission signal remains uninfluenced by the operation of the phase shifter and the attenuator.

6. The bridge circuit as claimed in claim 3, wherein the attenuator and the phase shifter are set such that the transmission signal from the first electrical line and the rest of the transmission signal from the second electrical line meet at the third circuit point RX in equal proportions but with a 180 degree relative phase shift.

7. The bridge circuit as claimed in claim 1, wherein an amplitude and/or a phase of the first divided transmission signal are tuned via pin diodes and/or varactor diodes.

8. The bridge circuit as claimed in claim 1, wherein the resonator is impedance matched and the transmission signal is unevenly divided at the first circuit point TX.

9. The bridge circuit as claimed in claim 1, wherein the circuit is operated at a frequency of around 10 GHz, and wherein outer dimensions of the circuit do not exceed 1 cm×3 cm×3 cm.

10. An ESR spectrometer comprising:
   an RF generator for generating the transmission signal;
   a splitter for dividing the transmission signal between at least one mixer and a first amplifier for amplifying the transmission signal; and
   a microwave bridge circuit as claimed in claim 1 that receives the amplified transmission signal from the first amplifier.

11. The ESR spectrometer as claimed in claim 10, further comprising a second amplifier for amplifying the reception signal forwarded from the bridge circuit.

12. The ESR spectrometer as claimed in claim 10, wherein the first amplifier and the second amplifier are attached to the bridge circuit without any cables.

13. The ESR spectrometer as claimed in claim 10, wherein the bridge circuit has a receiver input stage arranged directly on the resonator.

14. The ESR spectrometer as claimed in claim 10, wherein the microwave bridge circuit comprises a fixed-frequency bridge.

* * * * *